United States Patent
Tsironis (10) Patent No.: US 10,348,273 B1
(45) Date of Patent: Jul. 9, 2019

(54) HYBRID DIGITAL ELECTRONIC TUNER

(71) Applicant: Christos Tsironis, Dollard-des-Ormeaux (CA)

(72) Inventor: Christos Tsironis, Dollard-des-Ormeaux (CA)

(*) Notice: Subject to any disclaimer, the term of this patent is extended or adjusted under 35 U.S.C. 154(b) by 0 days.

(21) Appl. No.: 15/862,671

(22) Filed: Jan. 5, 2018

Related U.S. Application Data

(60) Provisional application No. 62/443,168, filed on Jan. 6, 2017.

(51) Int. Cl.

| | | |
|---|---|---|
| *H03H 7/38* | (2006.01) | |
| *H03J 3/08* | (2006.01) | |
| *H03D 7/14* | (2006.01) | |
| *G10H 1/44* | (2006.01) | |
| *H03J 5/02* | (2006.01) | |
| *H03J 3/04* | (2006.01) | |
| *H03H 7/40* | (2006.01) | |

(52) U.S. Cl.
CPC ............... *H03J 3/08* (2013.01); *G10H 1/44* (2013.01); *H03D 7/1425* (2013.01); *H03H 7/40* (2013.01); *H03J 3/04* (2013.01); *H03J 5/0263* (2013.01)

(58) Field of Classification Search
CPC ........ H03H 7/38; H03H 7/40; H04L 25/0278; G01R 31/2614; G01R 31/2822
USPC ............ 333/32, 33, 17.3, 263; 324/637, 641
See application file for complete search history.

(56) References Cited

U.S. PATENT DOCUMENTS

| | | |
|---|---|---|
| 5,034,708 A | 7/1991 | Adamian et al. |
| 7,282,926 B1 | 10/2007 | Verspecht et al. |
| 9,331,670 B1 | 5/2016 | Mahmoudi et al. |
| 9,660,607 B2 | 5/2017 | Boudiaf et al. |

OTHER PUBLICATIONS

"A New Load-pull Characterization Method for Microwave Power Transistors," Y. Takayama, [online], 1976 IEEE Microwave Theory & Techniques Society (MTT-S) International Microwave Symposium, pp. 218-220. [Retrieved on Apr. 6, 2017]. Retrieved from Internet <URL: http://ieeexplore.ieee.org/document/1123701/>.
"Active Load Pull System, ALPS", Product Note 33, Focus Microwaves, 1966, p. 3, Figure 3.
"High resolution tuners eliminate load pull performance errors", Application Note 15, Focus Microwaves, Jan. 1995, pp. 6 and 7.
"PIN Diode" [online], [Retreived on Jan. 5, 2017]. Retrieved from Internet <URL: https://en.wikipedia.org/wiki/PIN_diode>.

*Primary Examiner* — Stephen E. Jones (57) ABSTRACT

A hybrid digital electronic tuner (HDET) uses a modified forward signal power injection technique, a variance of a prior art Gamma Boosting Unit (GBU) technique, cascaded with a digital, PIN diode based, electronic tuner, all integrated in the same low loss parallel plate airline (slabline) to create a compact hybrid tuner unit able of generating thousands of high reflection factors (|Gamma|≥1) at millisecond tuning speed.

8 Claims, 13 Drawing Sheets

HYBRID DIGITAL ELECTRONIC TUNER

PRIORITY CLAIM

This application claims priority on provisional application 62/443,168, titled: Active Digital Electronic Tuner, filed on Jan. 6, 2017.

CROSS-REFERENCE TO RELATED ARTICLES

1. "A New Load-pull Characterization Method for Microwave Power Transistors," Y. Takayama, [online], 1976 IEEE Microwave Theory & Techniques Society (MTT-S) International Microwave Symposium, pp. 218-220. [Retrieved on 2017 Apr. 6]. Retrieved from Internet <URL: http://ieeexplore.ieee.org/document/1123701/>.
2. "Active Load Pull System, ALPS", Product Note 33, Focus Microwaves, 1966, page 3, FIG. 3.
3. Mahmoudi et al., U.S. Pat. No. 9,331,670, "Gamma Boosting Unit (GBU) for Hybrid Load and Source Pull".
4. Verspecht et al., U.S. Pat. No. 7,282,926, "Method and an apparatus for characterizing a high-frequency device-under-test in a large signal impedance tuning environment".
5. "High resolution tuners eliminate load pull performance errors", Application Note 15, Focus Microwaves, January 1995, pages 6 and 7.
6. Adamian et al., U.S. Pat. No. 5,034,708, "Programmable Broadband Electronic Tuner".
7. "PIN Diode" [online], [Retreived on 2017 Jan. 5]. Retrieved from Internet <URL: https://en.wikipedia.org/wiki/PIN_diode>
8. Boudiaf, et al., U.S. Pat. No. 9,660,607, "Solid State Impedance Tuners".

BACKGROUND OF THE INVENTION

This invention relates to high power (nonlinear) testing of microwave transistors (DUT). When the transistors are driven in their nonlinear operation regime their internal output impedance is very low. An impedance tuner used to match the transistor must also conjugate-match this impedance, i.e. the reflection factor presented by the tuner to the DUT must have the same amplitude and the opposite phase: $\Gamma_{tuner} = \Gamma^*DUT$. Passive impedance tuners can reach maximum reflection factors $|\Gamma_{tuner}|$ of the order of 0.95, corresponding (in a 50Ω system) to impedances of 2.4Ω. The insertion loss, created by RF cables, test fixtures etc. between the DUT and the tuner reduces the available tuning range at the DUT reference plane and thus the capacity of the passive tuner to match the transistor. The only unconditional remedy to this limitation is using active systems, i.e. test systems whereby a signal, coherent with the signal which is injected into the input and exits from output of the DUT, is reverse-injected simultaneously into the output of the DUT, coming from the load, and creates a "virtual" load. This additional signal can be the only one injected, in which case we speak of purely "active" load pull, or it can be superimposed to signal reflected by a passive tuner, in which case we speak of "hybrid" load pull; obviously, if only a (mechanical or electronic) tuner is present, we speak of "passive" load pull. In both active injection cases (pure active and hybrid) the objective is to reach and conjugate match the internal impedance of the transistor; in general terms a standard requirement is a dynamic tuning range reaching a reflection factor $|\Gamma|=1$ at the DUT reference plane (corresponding to an internal DUT impedance close to 0Ω); because of the above mentioned insertion losses between DUT and tuner, however, it is necessary that, at the tuner reference plane the generated reflection factor $\Gamma_{tuner}$ be $|\Gamma_{tuner}|>1$. The objective of this invention is a hybrid (active plus passive) tuner apparatus, combining a forward signal injection mechanism with a passive electronic tuner, allowing $|\Gamma|\geq 1$. It must be clarified at this point that "electronic" does not mean "active". Electronic tuners, as disclosed here, are passive, but not electro-mechanical.

Passive automatic (remotely controlled) tuners are either electromechanical (see ref. 5) or electronic (see ref. 6). Electromechanical tuners cover high frequency bandwidth (are wideband), generate high reflection factor (Gamma), are linear, have high tuning resolution, but they are slow, because of the mechanical movement. Electronic tuners use PIN diodes (see ref. 7), and have smaller bandwidth, lower maximum reflection factor Gamma, lower linearity and resolution than mechanical tuners, but they are extremely fast (they switch states in milli-seconds versus seconds of mechanical tuners); so in essence we are talking about an increased speed ratio (or reduced tuning time) of 1000:1. For a number of applications electronic tuners, if enhanced with active modules, as in this invention, can reach maximum reflection factor |Gamma|≥1 and can exploit their high tuning speed. And as modern test technologies evolve into automatic testing a large number of on-wafer chips, speed is of essence and may overcome other, above mentioned, comparative weaknesses of electronic tuners.

DESCRIPTION OF PRIOR ART

There have been several attempts at active load pull systems, starting back in the 70'ies (see ref. 1 and 2). Such load pull techniques use the so called "virtual load" method. The virtual load method consists in injecting into the output of the DUT RF coherent signal power at the same frequency as traversing the DUT from the input to the output, but with statically controlled phase and amplitude. Knowing that the reflection factor "seen" by the DUT is equal to the ratio of returned (reflected) power wave <a> to primary output power wave <b>: ($\Gamma$=<a>/<b>, FIG. 8), it is understood that by controlling the phase and amplitude of <a> for a constant <b> we can control $\Gamma$. Another method is the active forward injection, also called Gamma Boosting Unit (GBU), see ref. 3, and FIG. 1. In this Figure the reflected signal <b3> at the passive load pull tuner (LP tuner) is coupled by coupler $DC_B$ and injected into the amplifier G after adjusting its amplitude and phase ($\varphi$, $\tau$) and is injected back towards the DUT by coupler $DC_A$; both signals, the remainder of <b3>, after losing part into coupler $DC_B$, and the coupled signal through $DC_A$ are added into <a2> at the DUT port, creating an increased TL. A variance of this method is used in this invention in the sense that the signal from the DUT, <b*C1> (FIG. 8), instead of the reflected signal <b3> (FIG. 1), is directly coupled into the amplifier and returned into the DUT (<b*G*C1*C2>). Further-on the invention uses the capability of wave-probes (see ref. 4) to couple the signal into and from the amplifier network and adjust the coupling factor and the phase, when properly used in a slabline-based mechanical tuner structure, in which the electronic tuner is also incorporated. Even though wave-probes are in reality bi-directional couplers, because the secondary (isolated) port #4 (FIG. 2) is always terminated and not used, the wave-probes are called here "directional" (instead of "bi-directional") couplers.

BRIEF DESCRIPTION OF THE INVENTION

Figure 1:
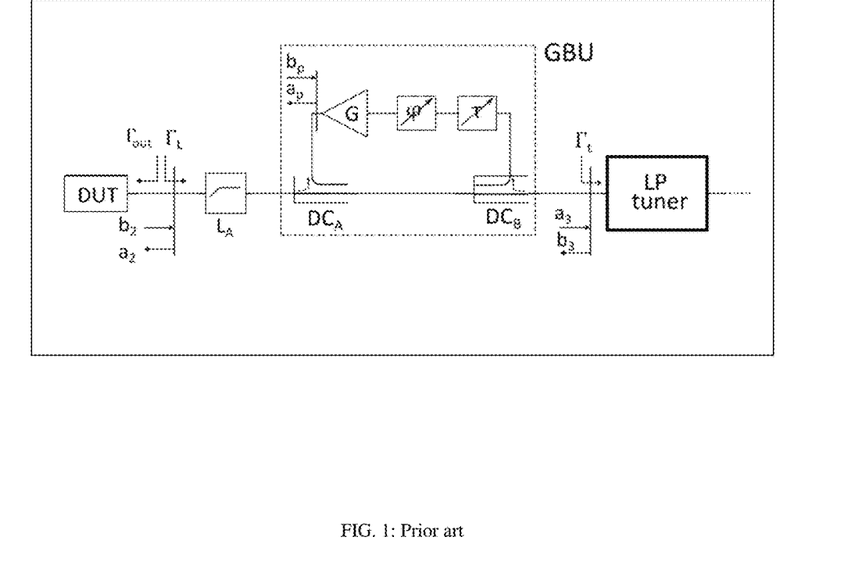
FIG. 1 depicts prior art, the Gamma Boosting Unit, a forward coupling active injection system, (see ref. 1).
Figure 2:
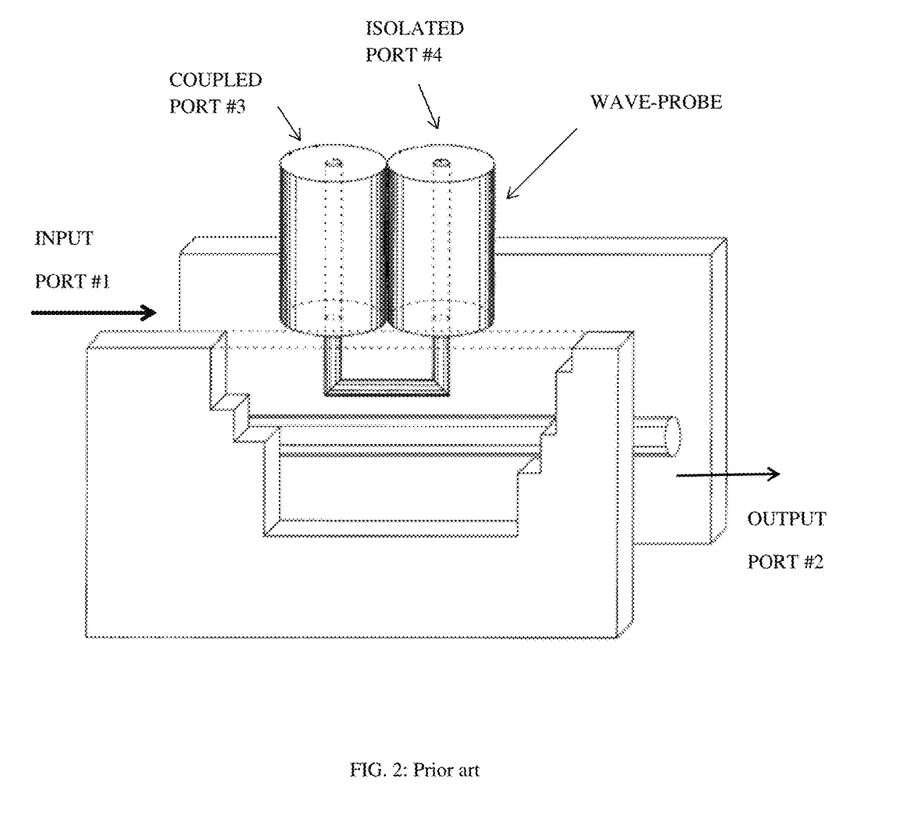
FIG. 2 depicts prior art, a compact signal coupler using a folded semi-rigid coaxial cable, ("wave-probe",).
Figure 5:
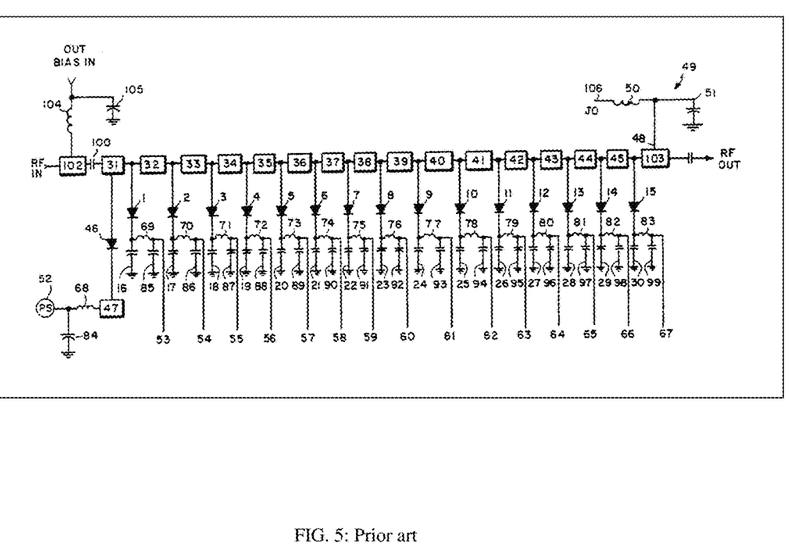
FIG. 5 depicts prior art, basic structure of electronic tuner using PIN diodes.
Figure 9:
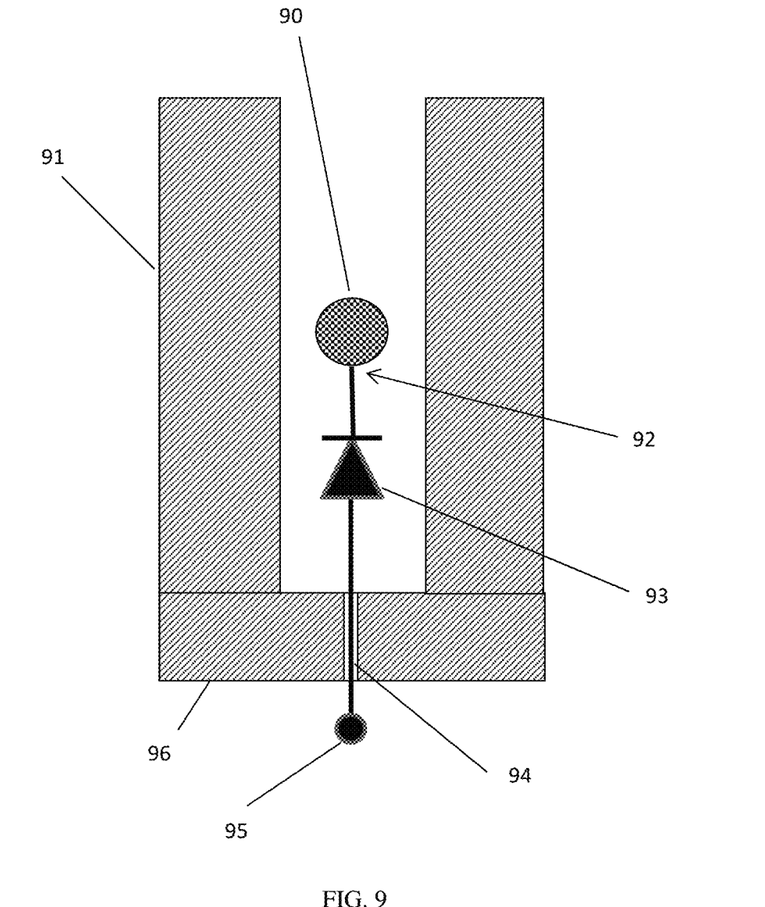
FIG. 9 depicts mounting of PIN diodes in slabline.
Figure 10:
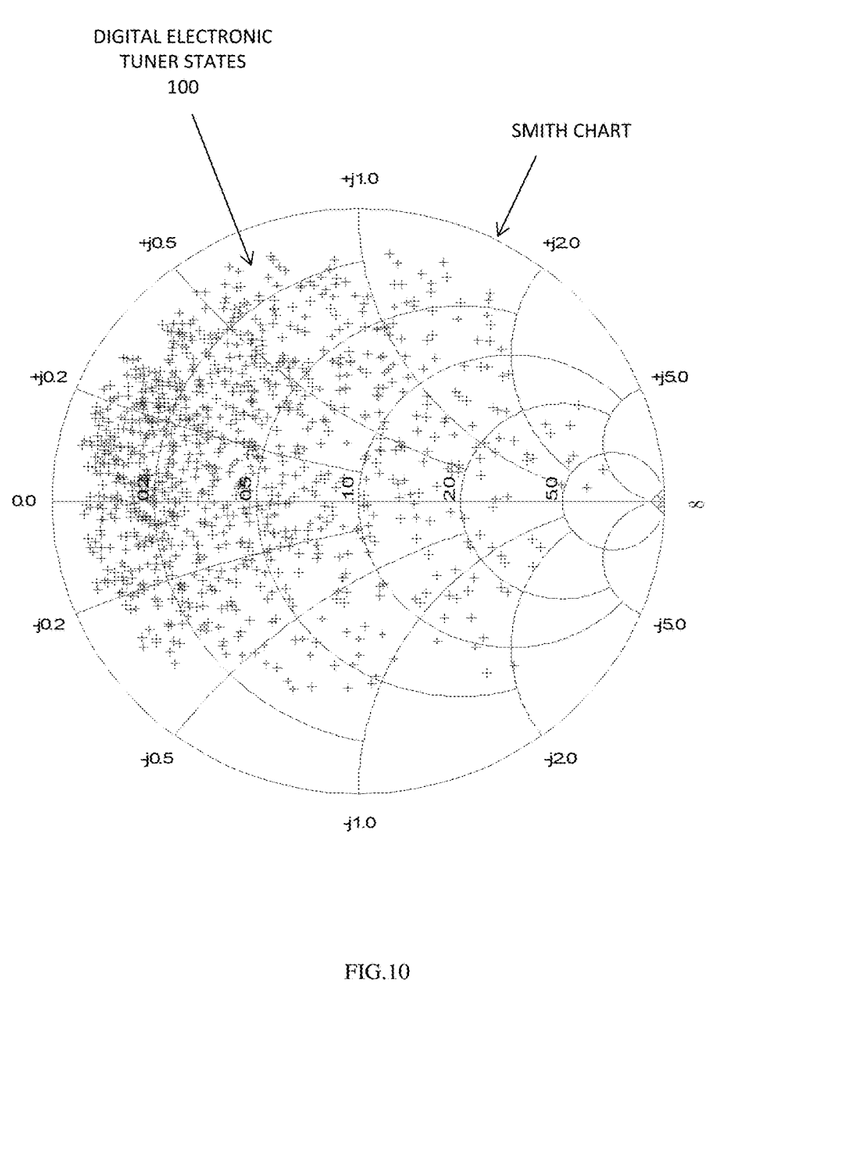
FIG. 10 depicts tuning states of electronic tuner, using 10 PIN diodes.

The concept used in this invention to create the active part of the load is the forward injection technique, also called Gamma Boosting Unit (GBU), FIG. 1, 5. The GBU samples a portion of the reflected travelling signal (coupler $DC_B$ in FIG. 1), adjusts its phase using a phase shifter (φ), amplifies it using the amplifier G, adjusts its amplitude (attenuation (τ)) and couples it back (coupler $DC_A$ in FIG. 1) in reverse direction into the main signal path <b2>. The new way this concept is implemented in this invention, though, not only couples the original signal <b> into the amplifier G but also eliminates the need for both the phase shifter φ and the attenuator τ; this creates a better, simpler and more effective solution and allows independent calibration of the two modules and integrating with an electronic impedance tuner in the same slabline with minimum transition loss between the modules. One possible embodiment of digital electronic tuners uses conventional PIN diodes mounted on microstrip structure (FIGS. 5 and 13). Another embodiment (FIGS. 5, 7, 9) uses PIN diodes mounted on the bottom side 92 of the center conductor 90 of the slabline 91, 96, shown in the cross section of FIG. 9. The combination of the reflection factors of the individual diodes, when switched between ON and OFF, creates a multitude of impedances spread over the Smith chart (FIG. 10). When cascading reflection factors shown in FIG. 10, which are created by the electronic tuner of FIG. 13, with the pre-matching reflection factors 110 (FIG. 11), created by the active module, shown in FIGS. 6 to 8, the transformed overall reflection factors 120 presented to the DUT are shown in FIG. 12. In particular active pre-matching vector 112 transforms the original tuning states 100 into a new cloud of tuning states 124, because it adds to, amplifies and shifts the original tuning states 121 towards the $3^{rd}$ quadrant of the Smith chart 123.

BRIEF DESCRIPTION OF THE SEVERAL VIEWS OF THE DRAWINGS

The invention and its mode of operation will be more clearly understood from the following detailed description when read with the appended drawings in which.

DETAILED DESCRIPTION OF THE INVENTION

Figure 6:
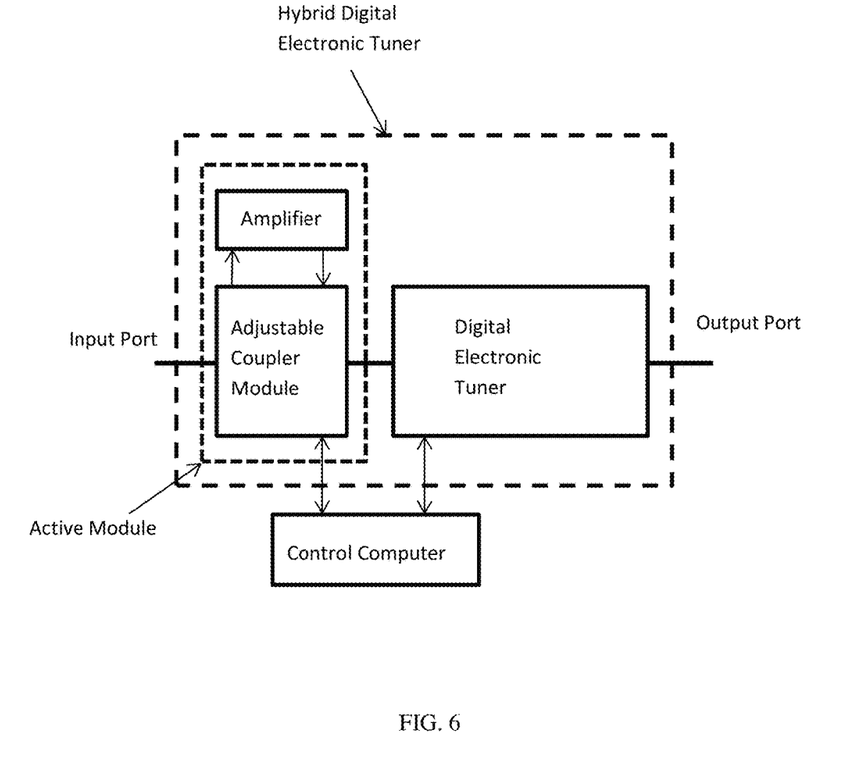
FIG. 6 depicts block diagram of Hybrid Digital Electronic Tuner (HDET) system.

The concept of the Hybrid Digital Electronic Tuner (HDET) is shown in FIG. 6. It comprises a cascade of Active Module and Digital Electronic Tuner. Both are mounted on the same slabline which reaches from input to output port and are remotely controlled by a control computer. The active module comprises a set of directional couplers and an amplifier. The electronic tuner comprises a multitude of N>2 (typically N=10 to N=16) PIN diodes 702 (FIGS. 7 and 13) which, in the case of FIG. 7, are mounted between the bottom side of the center conductor 78 of the slabline 79 and ground 708, also shown in FIG. 9, and are controlled by an electronic control board 704 and a computer controller 705.

Figure 7:
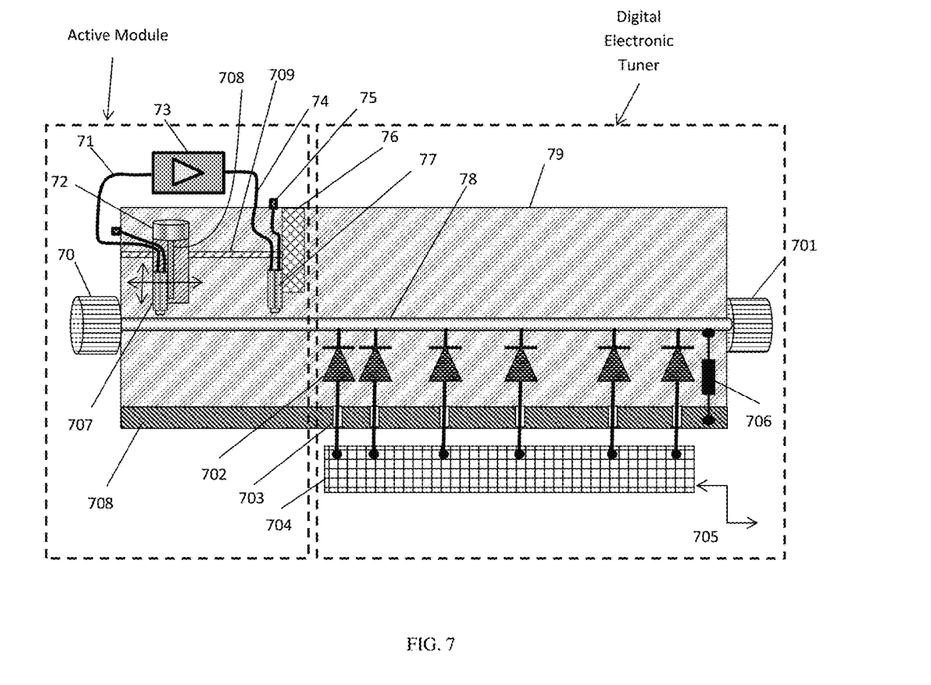
FIG. 7 depicts detailed structure of HDET.

In FIG. 7, the diodes 702 have an Anode connected with the center conductor 78 and a Cathode connected to ground 708. The ground connection occurs via a "feed-through" Capacitor 703, 94 so that the Cathode terminal 95 of the diode 93 can be biased through the switch control board 704. The center conductor 78 is set to a fixed DC potential, in this case 0V (or grounded) using a choc coil inductor 706, which allows DC to flow through, but prevents RF signal to be diverted from the center conductor 78 to ground 708. The control board 704 is digitally connected 705 with a PC controller. FIG. 9 shows the mounting technique of the diodes 93. They are attached to the bottom 92 of the center conductor 90 of the slabline 91, 96 in the area of minimum electric field, and are RF grounded using feed-through capacitors 94, so their Cathode 95 is accessible to DC ON/OFF bias control. Alternative configurations of digital electronic tuners are possible, especially on microstrip structures or combinations of such structures with signal couplers (see ref. 8).

Figure 3:
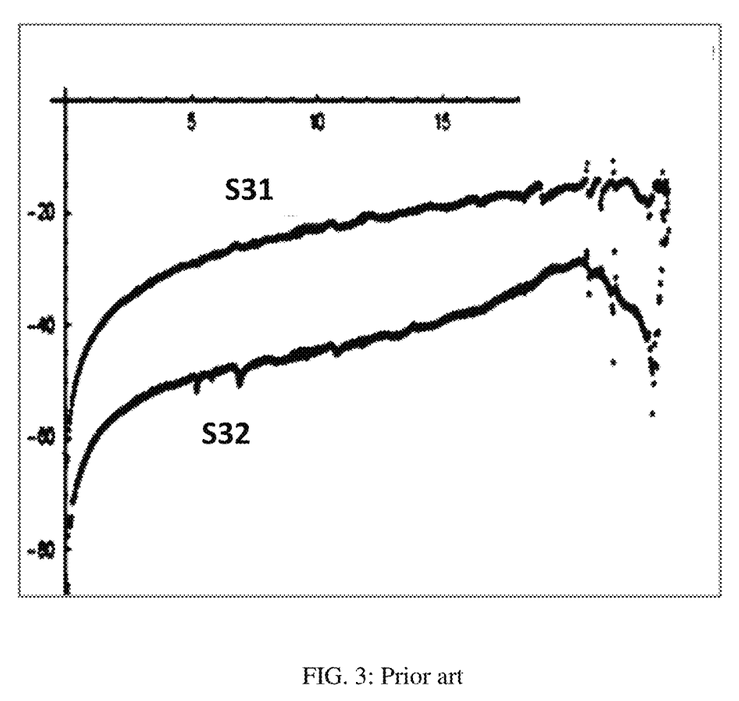
FIG. 3 depicts prior art, coupling factor and directivity of wave-probe coupler.
Figure 4:
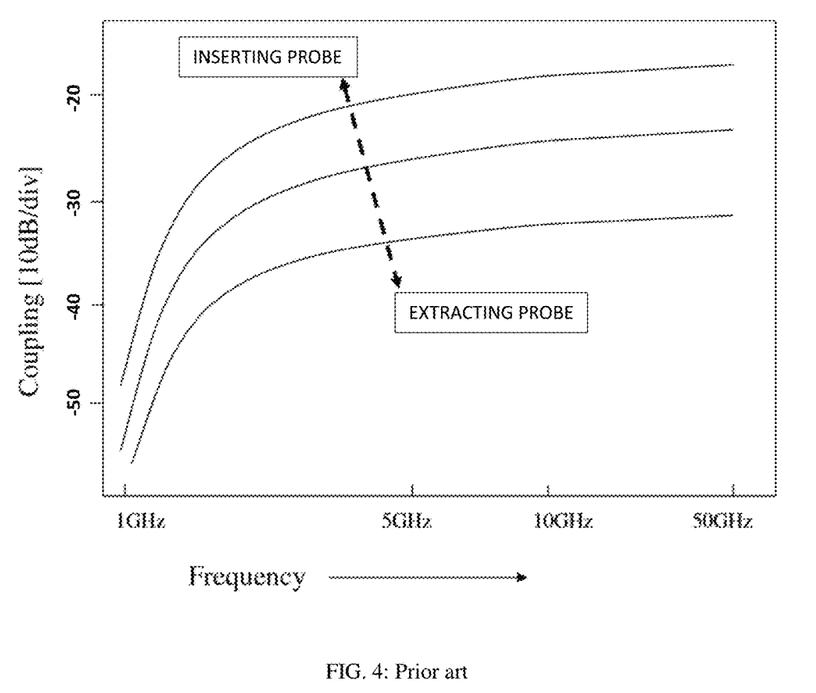
FIG. 4 depicts prior art, variation of coupling factor of wave-probe when inserted or withdrawn from a slabline.

The active module unit comprises two wave probes 707 and 77. One wave-probe, 77, is attached to a fixed support 76 and is adjusted to provide a fixed coupling factor S31 at any given frequency (FIG. 3). The coupling factor shown in FIG. 3 varies between −25 and −15 dB (in linear meaning that between 0.3% and 3% of the signal power is coupled into the "coupled" port, and between −50 and −40 dB (0.01% and 0.1%) are coupled into the "reverse coupled" or "isolated" port). Coupler 707 being attached to the vertical axis 709 of the carriage 72 can be inserted and withdrawn from the slabline, thus adjusting the coupling factor at will, as shown in FIG. 4. The isolated ports of both couplers 707 and 77 are terminated with the characteristic impedance Zo—typically 50Ω, item 75. The coupled port of wave-probe coupler 707 is connected using a length of RF cable 71 with the input port of the amplifier 73 and the output port of the amplifier 73 is connected using a second length of RF cable 74 with the coupled port of the fixed wave-probe coupler 77. The carriage 72 is moved along the axis of the slabline 79 using a lead screw 709 which is controlled by a stepper motor (not shown). This mechanism allows the amount of signal coupled into the amplifier 73 to be controlled through the penetration level of wave-probe 707 and the phase of the coupled signal to be controlled through the horizontal distance between the mobile probe 707 and the fixed probe 77. The preferable operation for lowest loss and highest reflection factor is for the mobile wave-probe 707 to be placed closest to the test port 70, followed by the fixed probe 77 and then by the block of electronic switches (PIN diodes) 702 towards the idle port 701.

Figure 11:
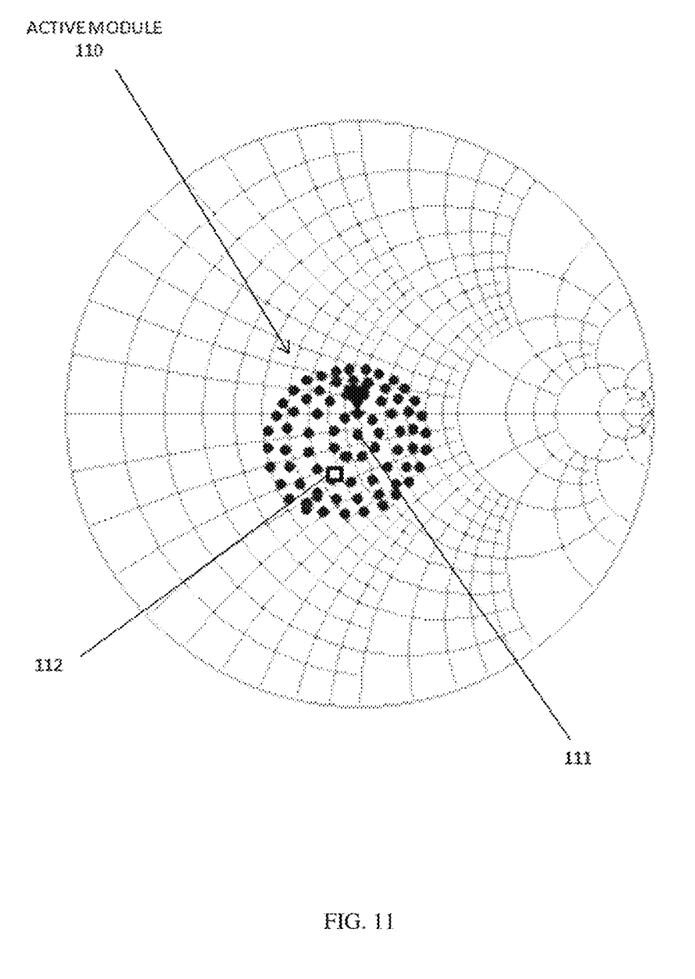
FIG. 11 depicts reflection factors generated by active injection tuning of active module.
Figure 12:
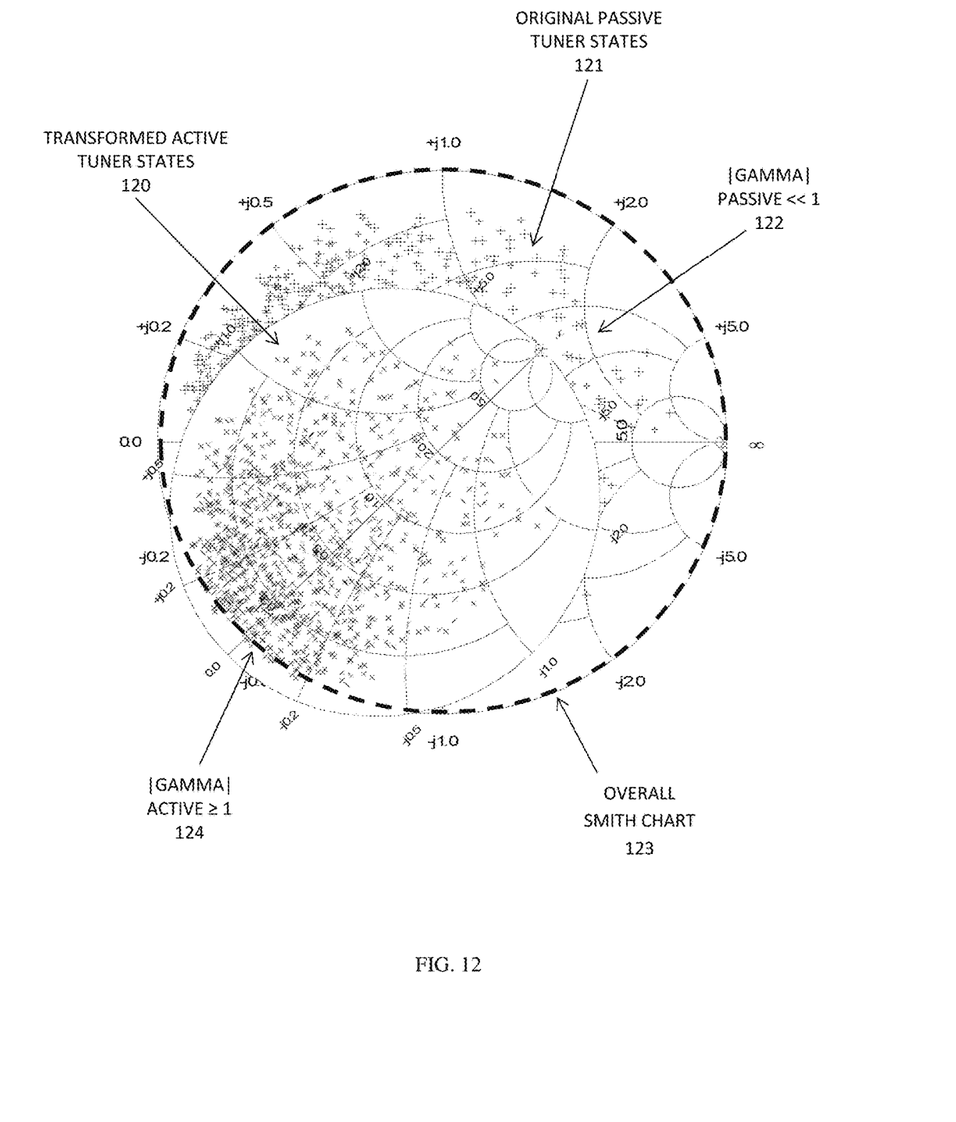
FIG. 12 depicts reflection factors generated by combining a fixed active tuning (as a pre-match, a single point 112 in FIG. 11) with variable electronic tuning (all points in FIG. 10).
Figure 13:
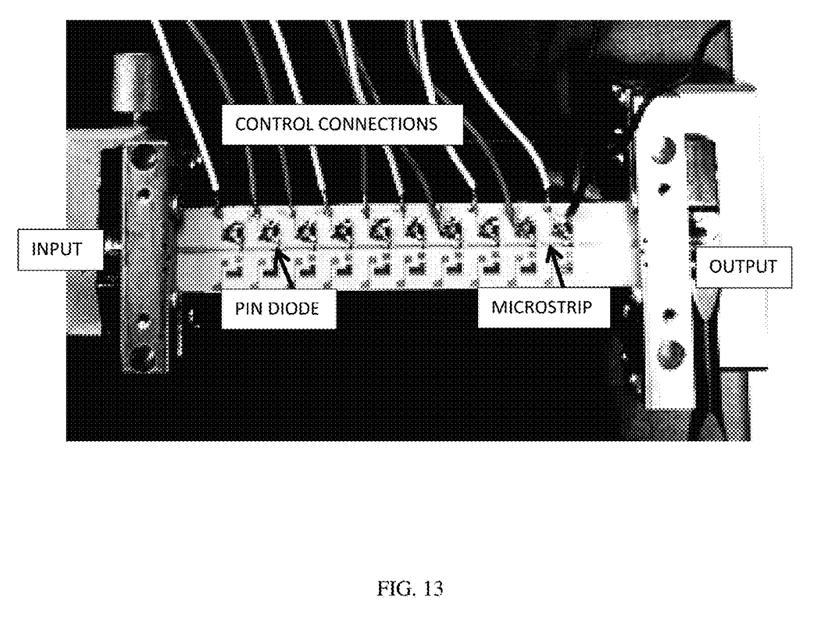
FIG. 13 depicts digital electronic tuner on microstrip using 10 PIN diodes and creating 1024 distinct tuner states.

The tuning mechanism is shown in FIGS. 10, 11 and 12: FIG. 10 shows the tuner states 100 of the digital electronic tuner in FIG. 6. Each point on the Smith chart corresponds to a different ON/OFF combination of all PIN diodes 702. If N diodes are used we have $2^N$ combinations (N=8 results in 256 states, N=16 results in 65,536 states etc.). Such tuners typically use 12 diodes (4,096 states). However, since the distance between diodes is fixed, the reflection factors are not evenly distributed across the Smith chart, and, because diodes are not perfect short or open circuits when switched between ON and OFF states, there are always insertion losses, which reduce the maximum tuning range.

FIG. 11 shows the virtual reflection factors generated by the active module alone. What is seen on the Smith chart is the ratio <a> divided by <b> of reverse injected signal power wave to forward injected power wave (see FIG. 8). Each point on the Smith chart corresponds to a different horizontal and vertical position of the mobile wave-probe inside the slabline. Concentric circles correspond to horizontal movement of the carriage 72 and attached wave-probe 707 and vertical lines correspond to vertical movement of the axis 709 and wave-probe 707. The center of the concentric circles in FIG. 11, item 111 corresponds to the mobile wave-probe 707 withdrawn from the slabline, and thus creating <a>≈0 or reflection factor Γ=<a>/<b>≈Minimum. Γ does not become exactly zero, because of residual reflections in the system (the fixed wave-probe 77 creates such residual reflection, because it is permanently slightly coupled into the system, as do the non-perfect PIN diodes in their OFF state).

FIG. 12 shows the combined reflection factor states for all electronic tuner positions and one active module state. The original states 121 are transformed into new states 120. The active state chosen to generate this pattern is shown in FIG. 11, item 112, having the effect of shifting (transforming) the original states 121 towards the edge of the Smith chart and in direction of the active pre-matching vector 112. The general formula for calculating the resulting reflection factor S11.total of two cascaded two-ports [A] and [B], having s-parameters [SA.ij] and [SB.ij] is: S11.total=SA.11+(SA.12*SA.21*SB.11)/(1−SA.22*SB.11), meaning that the reflection factor of the first (pre-matching) two-port is predominant. In this particular case SA.11 is point 112 in FIG. 11 and SB.11 are all points in FIG. 10. The result (FIG. 12) is an increased tuning range |Γ|≥1, item 124, exceeding the periphery of the overall Smith chart 123. Of course, if all active vectors (tuning states) of FIG. 11 would be combined with the passive vectors (tuning states) of FIG. 10, then a new Smith chart would be formed with tuning range |Γ|≥1 at all angles. However, if the wave-probes are moved, this costs time, because it is a mechanical movement. Therefore the optimum operation is to select one appropriate active vector (example 112), which would shift the overall tuning range towards the optimum matching impedance of the DUT, and only use high speed electronic tuning around this point (cloud of points in FIG. 10), as shown in FIG. 12.

Figure 8:
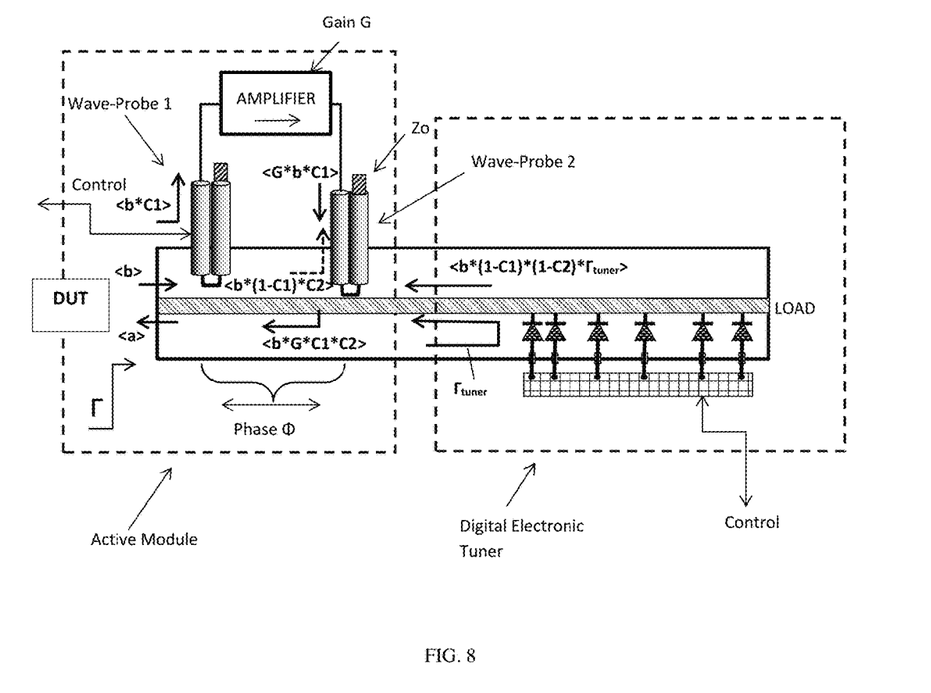
FIG. 8 depicts simplified signal flow in HDET.

The signal flow inside the active digital electronic tuner is represented, schematically, in FIG. 8. In the specification, to avoid misunderstandings, we use the < > bracket symbols to identify the power waves present in the system: <a> and <b>. The word "schematically" is used here, because, in reality the situation is more complex, if one considers residual phenomena, like non-infinite isolation of the wave-probe branches (see FIG. 3, S31 minus S32, in dB, or S31/S32 in linear format) and multiple back-and-forth reflections. The incoming signal power wave <b> is coupled first into the mobile wave-probe 1; the coupled quantity is <b*C1> whereby C1 is the coupling factor of this wave-probe 1 (C1<1). In FIG. 3, C1 corresponds to 10*exp(S31/10), for example S31=−20 dB corresponds to C=0.01. This value is adjustable as shown in FIG. 4; typical values used in this type of tuner for C1 (dB) are −10 to −15 dB (C1=0.1 to 0.03). The coupled signal is injected into and retrieved from the amplifier, through low loss RF cables; the amplifier has a gain of G (typically G=30 dB, in linear G=1000, or higher); the signal is injected back into the slabline through the fixed wave-probe 2; this portion amounts to <b*C1*G*C2>. The main signal <b>, after being reduced by the amount coupled into wave-probe 1 is <b*(1−C1)>. This signal is travelling towards the second wave-probe 2, where it loses again a small portion coupled into wave-probe 2 resulting in <b*(1−C1)*(1−C2)>, which is reflected at the electronic tuner with a reflection factor Γtuner. The total returned signal is therefore: <a>=<b>*(C1*G*C2+(1−C1)*(1−C2)*Γtuner> and the associated reflection factor is Γload=<a>/<b>=(C1*G*C2+(1−C1)*(1−C2)*Γtuner>. The total reflection factor can thus be ≥1, for any specific Γtuner, if C1, C2 and G are properly selected.

Depending on the actual value of C1, C2, G and Γtuner the magnitude of |Γload| can be equal or larger than 1. The need to reach values >1 is dictated by the fact that connections between the DUT and the tuner introduce insertion loss, which reduces the reflection factor at the DUT reference plane and must be compensated. Considering that all above coefficients are complex, having a real and imaginary part and backwards travelling waves are re-reflected forward, creating multiple reflections, it becomes obvious that such a situation cannot be handled analytically with a simple equation as above. It can only be processed with actually measured calibration data numerically, in which case only the net values of the various signal vectors, including the relative amplitudes and phases, as they arrive at the test port, after being coupled, amplified, injected and reflected, are taken into account.

The tuner must be calibrated before being used. This is done, at a user defined frequency, in linear operation of the amplifier (and assuming that the amplifier does not become non-linear in actual operation) using a test setup which comprises (i) a pre-calibrated vector network analyzer (VNA), (ii) the tuner and (iii) a control computer connected operationally with the VNA. The tuner is connected with the test ports of the VNA using flexible RF cables. The VNA measures the four scattering parameters (s-parameters) S11, S12, S21 and S22, of the tuner for a multitude of horizontal and vertical positions of the wave-probes and the setting permutations of the diodes at selected frequencies. The wave-probe 1 positions are selected such that the created reflection factors cover a full circle area of the Smith chart (FIG. 11). Since the electronic switches are embedded in the same slabline (and housing) and, in order to avoid characterizing each of thousands settings of the combined active and electronic tuner units, a calibration technique, called "de-embedding", must be used. This technique comprises measuring the slabline s-parameters from test to idle ports when the tuner is "initialized", i.e. the wave-probe 1 is withdrawn and all diodes are in OFF state. This set of s-parameters is called the "initialization tuner matrix", [S0]. Following that the s-parameters of all states of the active module are measured and saved. Then all s-parameters of all the electronic tuner states are measured with wave-probe 1 withdrawn and de-embedded (cascaded with the inverse matrix [S0]$^{-1}$) and saved. Finally the permutations of active module s-parameters and electronic module s-parameters are generated through s-parameter cascading in computer memory. In practical terms, if the active module has 500 states and the electronic module has 1000 states, then the combined state permutations to be characterized are 500, 000. If the hereby described de-embedding method is applied, then only 1,500 states must be measured, a shortening of the calibration time by a factor of over 300.

Obvious alternative embodiments are imaginable but shall not impede on the originality of the idea of using slabline based phase and amplitude adjustable signal coupling structure to create a hybrid (active-passive) electronic load pull tuner.

What I claim as my invention is:

1. A hybrid digital electronic impedance tuner (HDET) comprising two modules,
   a) an active tuner module, and
   b) a passive tuner module,
   wherein
      the active module comprises two ports, an input (test) port and an output (idle) port, and
      a slotted airline (slabline) between the ports, two directional signal couplers (wave-probes) and an amplifier;
   wherein
      the slabline comprises metallic, grounded sidewalls, a center conductor between the ports and the two wave-probes, of which one is fixed and one is mobile,
   and wherein
      each wave-probe comprises a coupled port and an isolated port,
   and wherein
      the mobile wave-probe is attached on an adjustable vertical axis of a mobile carriage, said the vertical axis controlling the penetration of the mobile wave-probe into the slot of the slabline,
   and wherein
      the carriage slides across the length of the slabline;
   and wherein
      the passive tuner module comprises a multitude of RF electronic switches (PIN diodes), and is incorporated in the section of the slabline between the active module and the output port.

2. The tuner of claim 1, wherein the RF electronic switches of the passive module are inserted along the section of the slabline between the active tuner module and the output port, mounted between the bottom of the center conductor of the slabline and ground.

3. The tuner of claim 2, whereby the wave-probes are inserted between the walls of the slabline and placed between the test port and the multitude of electronic switches.

4. The tuner of claim 3, wherein the mobile wave-probe is mounted closest to the test port.

5. The tuner of claim 4, wherein the coupled port of the mobile wave-probe is connected to the input port of the amplifier and the output port of the amplifier is connected to the coupled port of the fixed wave-probe, and
   wherein
      the isolated ports of both wave-probes are terminated with characteristic impedance.

6. The tuner of claim 5 whereby the position of the mobile carriage moving along the slabline and the position of the vertical axis are remotely controlled using gear, control processor and appropriate control software.

7. The tuner of claim 6, whereby each of the multitude of electronic switches is DC biasable and RF grounded and individually controlled between the ON and OFF states using appropriate electronic control.

8. A calibration method for the tuner of claim 7 at a user defined frequency comprising the following steps:
   a) the tuner is connected to a pre-calibrated vector network analyzer (VNA);
   b) the mobile wave-probe is withdrawn, all electronic switches are set to OFF (open circuit) and s-parameters of the tuner are measured and saved in a matrix [S0];
   c) the mobile wave-probe is gradually inserted into the slabline and the carriage moved horizontally creating a multitude of active module states and the s-parameters of the tuner are measured and saved;
   d) the mobile wave-probe is withdrawn and s-parameters of the tuner for all permutations of electronic switches between ON and OFF states are measured and saved;
   e) the s-parameters of step d) are de-embedded (cascaded with the inverse matrix $[S0]^{-1}$);
   f) the s-parameters of steps c) and e) are cascaded in computer memory and saved in calibration file for later use.

* * * * *